United States Patent
Chang et al.

(10) Patent No.: US 9,269,485 B2
(45) Date of Patent: Feb. 23, 2016

(54) METHOD OF CREATING SPIRAL INDUCTOR HAVING HIGH Q VALUE

(75) Inventors: Shih-Cheng Chang, Hsinchu (TW); Hui-Yu Lee, Hsinchu (TW)

(73) Assignee: TAIWAN SEMICONDUCTOR MANUFACTURING CO., LTD., Hsinchu (TW)

( * ) Notice: Subject to any disclaimer, the term of this patent is extended or adjusted under 35 U.S.C. 154(b) by 248 days.

(21) Appl. No.: 13/102,531

(22) Filed: May 6, 2011

(65) Prior Publication Data

US 2011/0227689 A1 Sep. 22, 2011

Related U.S. Application Data

(63) Continuation-in-part of application No. 11/946,899, filed on Nov. 29, 2007, now abandoned.

(51) Int. Cl.
| | |
|---|---|
| H01L 29/66 | (2006.01) |
| H01F 17/00 | (2006.01) |
| H01L 23/522 | (2006.01) |
| H01L 23/64 | (2006.01) |
| H01L 49/02 | (2006.01) |
| H01L 23/00 | (2006.01) |

(52) U.S. Cl.
CPC ........ *H01F 17/0013* (2013.01); *H01L 23/5227* (2013.01); *H01L 23/645* (2013.01); *H01L 28/10* (2013.01); *H01F 2017/002* (2013.01); *H01F 2017/0046* (2013.01); *H01F 2017/0073* (2013.01); *H01F 2017/0086* (2013.01); *H01L 24/06* (2013.01); *H01L 2924/14* (2013.01); *H01L 2924/3011* (2013.01); *Y10T 29/4902* (2015.01)

(58) Field of Classification Search
None
See application file for complete search history.

(56) References Cited

U.S. PATENT DOCUMENTS

| | | | |
|---|---|---|---|
| 4,959,705 A | 9/1990 | Lemnios et al. | |
| 5,095,357 A | 3/1992 | Andoh et al. | |
| 5,355,096 A | 10/1994 | Kobayashi | |
| 5,396,101 A | 3/1995 | Shiga | |
| 6,002,161 A | 12/1999 | Yamazaki | |
| 6,287,932 B2 | 9/2001 | Forbes et al. | |
| 6,344,125 B1 * | 2/2002 | Locke | H01L 21/2885 204/192.32 |
| 6,362,012 B1 | 3/2002 | Chi et al. | |
| 6,800,920 B2 | 10/2004 | Nishijima | |
| 6,830,970 B2 * | 12/2004 | Gardes | H01F 17/0006 257/277 |
| 7,005,721 B2 | 2/2006 | Nishijima | |
| 7,053,165 B2 | 5/2006 | Furumiya et al. | |
| 7,262,680 B2 | 8/2007 | Wang | |
| 7,414,506 B2 | 8/2008 | Furumiya et al. | |
| 2002/0050626 A1 * | 5/2002 | Onuma | H01F 17/0006 257/531 |

(Continued)

FOREIGN PATENT DOCUMENTS

CN 1881559 12/2006

*Primary Examiner* — David E Graybill
(74) *Attorney, Agent, or Firm* — McClure, Qualey & Rodack, LLP

(57) ABSTRACT

A method for fabricating an inductor structure having an increased quality factor (Q) is provided. In one embodiment, a substrate is provided and a plurality of metal layers are formed on the substrate. A spirally patterned conductor layer is formed over and in the substrate and in the metal layers to produce a planar spiral inductor. A via hole is formed over and in the substrate and in the metal layers within the spirally patterned conductor layer, the via hole being formed by a through silicon via (TSV) process. Thereafter, the via hole is filled with a core layer, wherein the core layer extends from a bottom surface of the substrate to a top surface of the metal layers.

4 Claims, 4 Drawing Sheets

(56) References Cited

U.S. PATENT DOCUMENTS

| | | |
|---|---|---|
| 2002/0142512 A1 | 10/2002 | Ma et al. |
| 2003/0068884 A1* | 4/2003 | Gardes ............... H01F 17/0006 438/667 |
| 2005/0190035 A1 | 9/2005 | Wang |
| 2008/0006882 A1 | 1/2008 | Huang |
| 2011/0272606 A1* | 11/2011 | Forbes et al. ................. 250/552 |

\* cited by examiner

METHOD OF CREATING SPIRAL INDUCTOR HAVING HIGH Q VALUE

CROSS REFERENCE TO RELATED APPLICATIONS

This application is a Continuation-In-Part of U.S. patent application Ser. No. 11/946,899, filed Nov. 29, 2007, the disclosure of which is hereby incorporated by reference herein in its entirety.

BACKGROUND

The present invention relates generally to a method of manufacturing inductor structures, and more particularly to a method of manufacturing a spiral inductor structure having a high quality factor Q, a spiral inductor structure, and a device package structure using the spiral inductor structure as a packing element.

An inductor is an impedance device typically including a coil, with or without a core, for introducing inductance to an electronic circuit. Both transformers and inductive reactors are included within the meaning of "inductor." Various inductors are shaped as coils wrapped on various core materials such as ferrites. The core multiplies the inductance of a given coil by the "permeability" of the core material. The core typically is in the shape of a rod or toroid. To obtain very high inductance, the coil typically includes many turns. Winding the coil on a closed loop iron or ferrite core can further increase the inductance. To obtain as pure an inductance as possible the DC resistance of the winding should be reduced to a minimum.

Inductor structures can find their use in semiconductor devices. Microelectronic or semiconductor devices are typically fabricated from a semiconductor substrate over which patterned conductor layers are formed and separated by dielectric layers. As the microelectronic arts have advanced, integration levels and functionality levels have increased so that not only conventional microelectronic or semiconductor structures such as transistors, resistors, diodes, capacitors are fabricated in or for use with the semiconductor device, but less conventional structures such as inductors have also been fabricated in or for use with the semiconductor or microelectronic device. In particular, in semiconductor or microelectronic devices that are intended to be employed with high frequency applications, such as mobile communications it is common to employ inductor structures within the semiconductor or microelectronic devices.

A variety of microelectronic conductor structures have been disclosed in the prior art. Many of these structures have a spiral design that is implemented in a plane with the spiral containing one or more turns in the plane of the inductor. For example, U.S. Pat. No. 5,396,101 discloses a planar spiral microelectronic inductor structure having formed within its center a core layer.

U.S. Pat. No. 6,002,161 discloses a semiconductor device including an inductor element which includes a first conductive film pattern of a spiral configuration formed on a major face of the semiconductor substrate. A second conductive film pattern of an insular configuration is electronically connected only to the first conductive film pattern through contact holes formed in the interlayer insulation film and extending in an overlapping relationship with the first conductive film pattern.

U.S. Pat. No. 6,287,932 discloses a spiral inductor fabricated from a semiconductor substrate that provides a large inductance while occupying only a small surface area. A magnetic material is provided either above or below the inductor to increase the inductance of the inductor. Magnetic material also acts as a barrier that confines electronic noise generated in the spiral conductor to the area occupied by the spiral inductor. The inductance of a pair of stacked spiral inductors is increased by including a layer of magnetic material between the stacked spiral inductors.

All of these approaches have as common objectives to enhance the quality factor Q of the inductor, to maximize the inductive value, and to reduce the surface area over which the inductor is created. As is understood by a person skilled in the art, a Q factor of a microelectronic inductor structure is in general described in terms of a ratio of energy storage capacity within the inductor structure with respect to power dissipation within the inductor structure. However, due to conventional inductors requiring a considerable amount of space for installation and difficulty in manufacturing conventional inductors due to their complex coil structure, conventional inductors have a low quality factor Q.

For these reasons and other reasons that will become apparent upon reading the following detailed description, there is a need for an improved spiral inductor structure having a high quality factor Q suitable for integration in IC chips.

SUMMARY

The present invention is directed to a method for fabricating an inductor structure having an increased quality factor (Q). In one embodiment, a substrate is provided and a plurality of metal layers are formed on the substrate. A spirally patterned conductor layer is formed over and in the substrate and in the metal layers to produce a planar spiral inductor. A via hole is formed over and in the substrate and in the metal layers within the spirally patterned conductor layer, the via hole being formed by a through silicon via (TSV) process. Thereafter, the via hole is filled with a core layer, wherein the core layer extends from a bottom surface of the substrate to a top surface of the metal layers.

BRIEF DESCRIPTION OF THE DRAWINGS

The features, aspects, and advantages of the present invention will become more fully apparent from the following detailed description, appended claims, and accompanying drawings in which:

DETAILED DESCRIPTION

In the following description, numerous specific details are set forth to provide a thorough understanding of the present invention. However, one having an ordinary skill in the art will recognize that the invention can be practiced without these specific details. In some instances, well-known structures and processes have not been described in detail to avoid unnecessarily obscuring the present invention.

Reference throughout this specification to "one embodiment" or "an embodiment" means that a particular feature, structure, or characteristic described in connection with the embodiment is included in at least one embodiment of the present invention. Thus, the appearances of the phrases "in one embodiment" or "in an embodiment" in various places throughout this specification are not necessarily all referring to the same embodiment. Furthermore, the particular features, structures, or characteristics may be combined in any suitable manner in one or more embodiments. It should be appreciated that the following figures are not drawn to scale; rather, these figures are merely intended for illustration.

Figure 1:
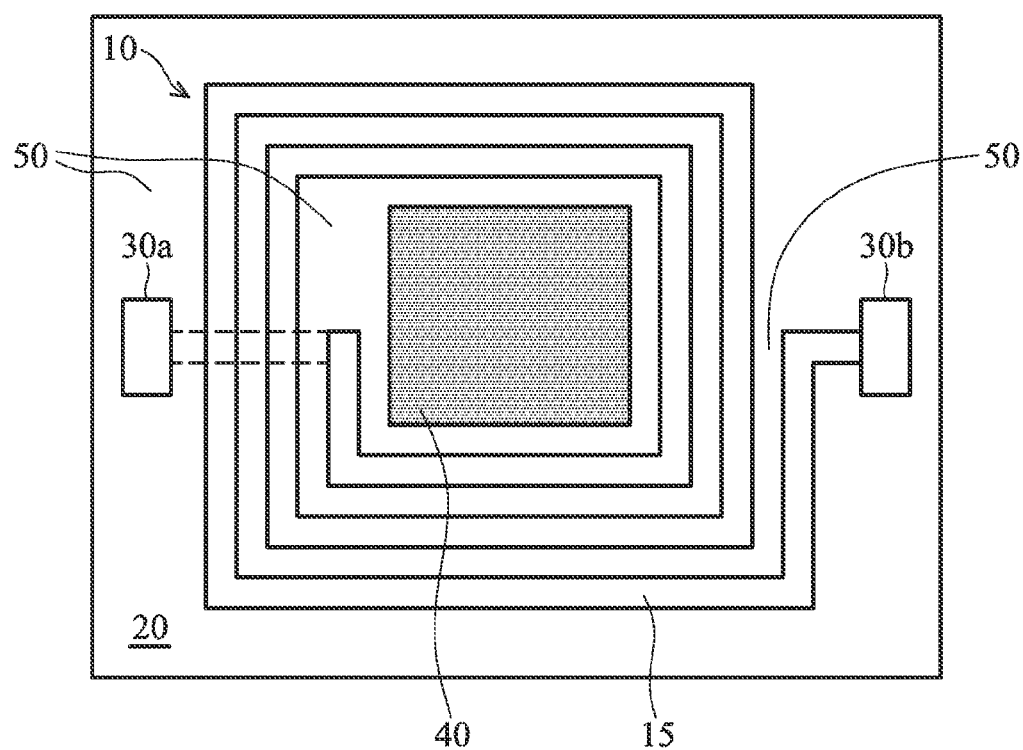
FIG. 1 is a plan view of an inductor structure according to one embodiment of the present invention.

With reference to FIG. 1, shown is a plan view of an inductor structure 10 according to one embodiment of the present invention. A substrate 20 which may be silicon (Si), silicon-on-insulator (SOI), or silicon-sapphire (SOS) is firstly provided, and a plurality of metal-containing layers 25 are formed on the substrate 20. The inductor structure 10 is fabricated over and in the substrate 20 and in the metal-containing layers 25. A conductor layer 15 is formed over and in the substrate 20 and in the metal-containing layers 25 and may be formed by conventional processes including but not limited to vapor deposition and sputtering. Conductor layer 15 may be formed of non-magnetic metal and non-magnetic metal alloy such as, but not limited to aluminum, aluminum alloy, copper and copper alloy and conductor materials such as, but not limited to magnetic metal and magnetic metal alloy such as permalloy. In this embodiment, the conductor layer 15 is shown to be spirally arranged and substantially square. However, it is understood that conductor layer 15 is not limited to this embodiment but may be substantially circular, rectangular, triangular, elliptical, or higher order polygonal geometries.

It is understood that the conductor linewidth is dependent on the design requirement and the fabrication process being employed. In one embodiment, conductor layer 15 is formed with a linewidth of from about 2 μm to about 20 μm. Conductor layer 15 terminates in a first bond pad 30a employing an underpass to an interior section of the spirally patterned conductor layer 15 and in a second bond pad 30b integral to an exterior section of the spirally patterned conductor layer 15.

Prior to forming a core layer 40 of the inductor structure 10, a via hole is formed within the dielectric layer 50 and within the central cavity defined within the center of the spirally patterned conductor layer 15. In one embodiment of the present invention, the via hole is formed by way of a through silicon via (TSV) process. Through silicon vias are essentially vertical connections etched through the silicon wafer and subsequently filled with a metal. These vias allow multiple chips to be stacked together and allow different chip components to be packaged much closer together for faster, smaller, and lowered-power systems.

Figure 2:
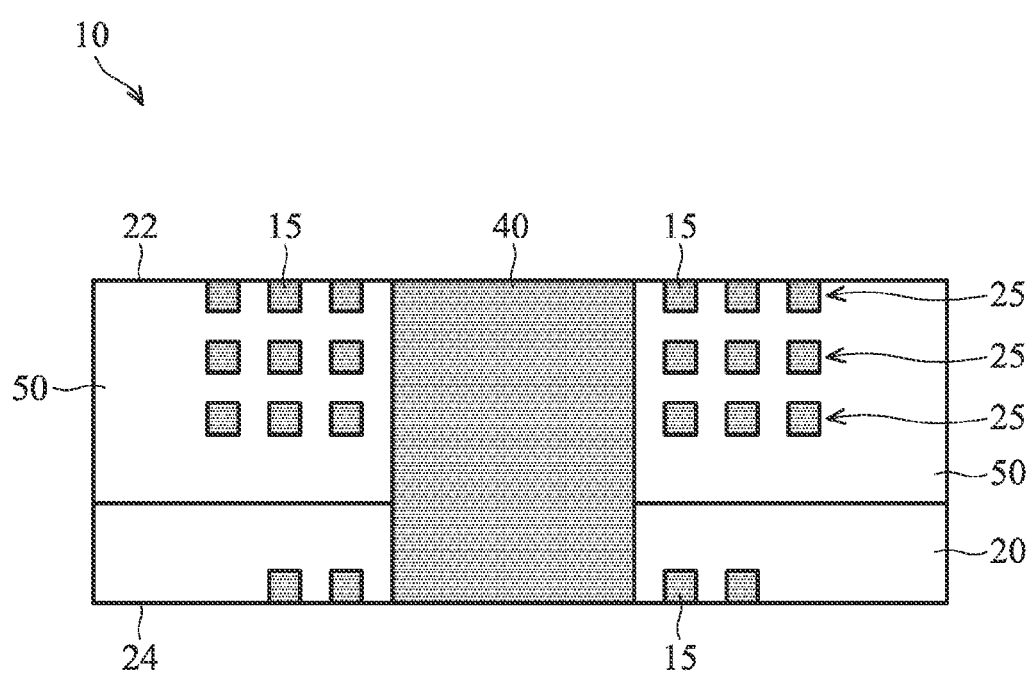
FIG. 2 is a cross-sectional view of the inductor structure of FIG. 1.

After forming the via hole, the via hole is then filled by a core layer 40. FIG. 2 shows a cross-sectional view of the inductor structure of FIG. 1 clearly showing the central core layer 40 is insulated from the conductor layer 15 and surrounded by the conductor layer 15. As shown in FIG. 1, core layer 40 is planar and substantially square as a whole and can be made of a high permeability magnetic material and formed of a ferromagnetic material such as, for example, iron, nickel, MnZn ferrite, NiZn ferrite, NiFe ferrite, NiCuZn alloy, other ferrites, mumetals, and mumetal alloys.

In conventional inductor structures, the core layers generally extend partially in the substrate but do not extend all the way from one end of the substrate to the other. In one embodiment of the present invention, core layer 40 is shown extended from a bottom surface 24 of substrate 20 to a top surface 22 of the metal-containing layers 25. By forming a core layer 40 with through silicon via technology and having the core layer 40 extend from a bottom surface 24 of substrate 20 to a top surface 22 of the metal-containing layers 25, the inductor structure 10 of the present invention can improve its Q value.

As is understood by those skilled in the art, the Q factor is related to the inductance L and is given by equation (1):

$$Q = \frac{1}{R}\sqrt{\frac{L}{C}},$$

where R, L, and C are the resistance, inductance, and capacitance of the circuit, respectively.

Now, consider a current loop δS with current i(t). According to Biot-Savart law, current i(t) sets up a magnetic flux density at r:

$$B(r,t) = \frac{\mu_0 \mu_r i(t)}{4\pi} \int_{\delta S} \frac{dl \times \hat{r}}{r^2}$$

Now magnetic flux through the surface S the loop encircles is given by equation (2):

$$\Phi(t) = \int_S B(r,t) \cdot dA = \frac{\mu_0 \mu_r i(t)}{4\pi} \int_S \int_{\delta S} \frac{dl \times \hat{r}}{r^2} \cdot dA = Li(t)$$

From there we get equation (3) for inductance of the current loop:

$$L = \frac{\mu_0 \mu_r}{4\pi} \int_S \int_{\delta S} \frac{dl \times \hat{r}}{r^2} \cdot dA$$

where
- $\mu_0$ is the permeability of free space ($4\pi \times 10^{-7}$ H/m),
- $\mu_r$ the relative permeability of the material within the inductor,
- dl is the differential length vector of the current loop element
- $\hat{r}$ is the unit displacement vector from the current element to the field point r
- r is the distance from the current element to the field point r
- dA is the differential vector element of surface area A, with infinitesimally small magnitude and direction normal to surface S From equation (3) and for a fixed geometry-shaped inductor, the inductance value L may be increased by the choice of $\mu_r$, the relative permeability of the material within the inductor. Equation (1) above shows that the higher the L value, the higher the Q factor value.

Figure 3:
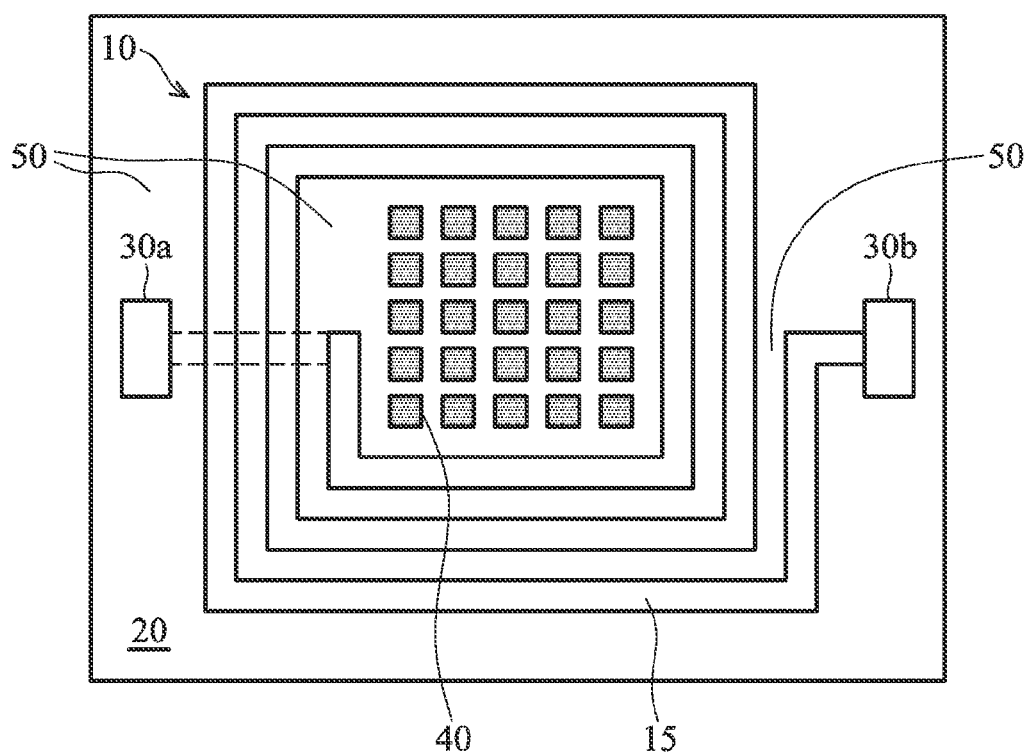
FIG. 3 is a plan view of an inductor structure according to another embodiment of the present invention.
Figure 4:
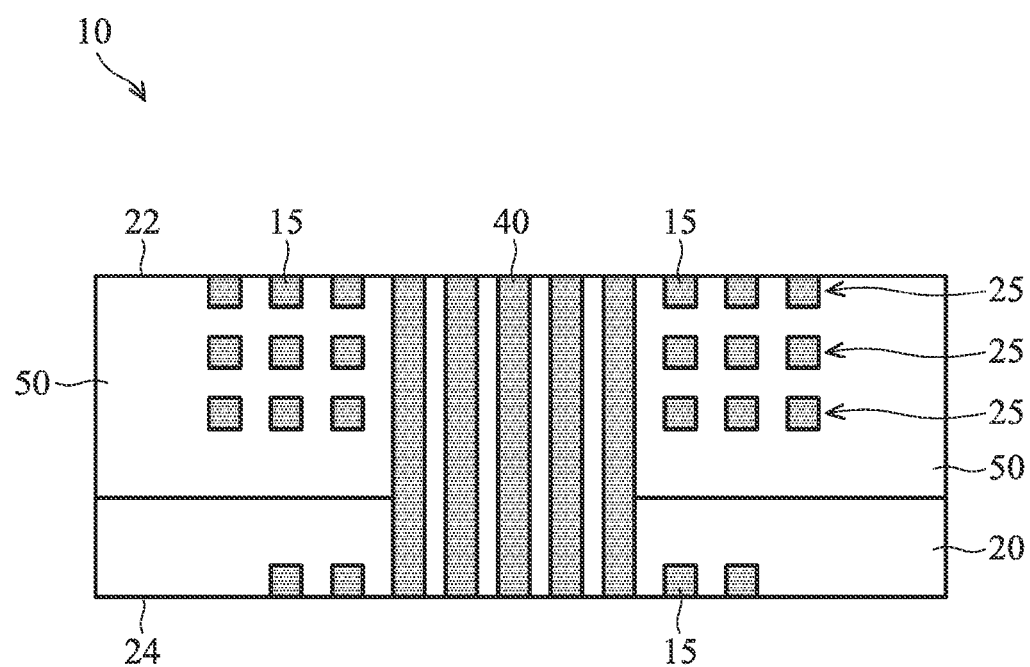
FIG. 4 is a cross-sectional view of the inductor structure of FIG. 3.

FIGS. 3 and 4 show both plan and cross-sectional views, respectively of the inductor structure 10 where the core layer 40 is divided into a grid of many small individual members each insulated from one another. These small members as a whole are used to form the core layer 40. A plurality of individual core layers 40 can reduce eddy-current power loss in transformer or inductor cores. Having reduced eddy-current power loss also reduces the thermal heat generated by the inductor structure.

In the exemplary embodiments of the present invention, the magnetic core layer 40 provides an enhanced Q factor for a microelectronic inductor structure fabricated in accord with the present invention. Although the shape of the core layer 40 shown in the figures here has been set square to conform to the shape of the spirally patterned conductor layer 15, the core portion may be circular when a circular spiral coil is employed or may be shaped in any form irrelevant to the spiral form. This also holds true with regard to the plurality of individual core layers.

In the preceding detailed description, the present invention is described with reference to specifically exemplary embodiments thereof. It will, however, be evident that various modifications, structures, processes, and changes may be made thereto without departing from the broader spirit and scope of the present invention, as set forth in the claims. The specification and drawings are, accordingly, to be regarded as illustrative and not restrictive. It is understood that the present invention is capable of using various other combinations and environments and is capable of changes or modifications within the scope of the inventive concept as expressed herein.

What is claimed is:

1. An inductor structure, comprising:
    a silicon wafer;
    a dielectric layer formed on the silicon wafer;
    a spirally patterned conductor layer formed over and in the silicon wafer and in the dielectric layer to form metal-containing layers, the spirally patterned conductor layer forming a planar spiral inductor;
    a via hole formed over and in the silicon wafer and in the metal-containing layers within the spirally patterned conductor layer, wherein the via hole is formed by a through silicon via (TSV) process and is formed through the silicon wafer; and
    a core layer filling the via hole, wherein the core layer extends from a bottom surface of the silicon wafer to a top surface of the metal-containing layers, and the core layer is insulated from the spirally patterned conductor layer and surrounded by the spirally patterned conductor layer.

2. The inductor structure of claim 1, wherein the core layer is made of a magnetic material.

3. The inductor structure of claim 2, wherein the magnetic material comprises iron, nickel, MnZn ferrite, NiZn ferrite, NiFe ferrite, NiCuZn alloy, other ferrites, mumetals, and mumetal alloys.

4. The inductor structure of claim 1, wherein the core layer comprises a plurality of individual members divided and insulated from each other.

* * * * *